US007166542B2

(12) United States Patent
Lo et al.

(10) Patent No.: US 7,166,542 B2
(45) Date of Patent: Jan. 23, 2007

(54) METHOD FOR FABRICATING PASSIVATION LAYER

(75) Inventors: Ming-Hung Lo, Taoyuan County (TW); Liang-Pin Chou, Taoyuan County (TW); Chun-Ming Wang, Taipei County (TW); Li-Fu Chen, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/707,112

(22) Filed: Nov. 21, 2003

(65) Prior Publication Data

US 2005/0074964 A1    Apr. 7, 2005

(30) Foreign Application Priority Data

Oct. 2, 2003 (TW) .............................. 92127267 A

(51) Int. Cl.
*H01L 21/31* (2006.01)
*H01L 21/469* (2006.01)
(52) U.S. Cl. ...................... 438/778; 438/787; 438/788; 438/789; 438/790
(58) Field of Classification Search ................ 438/778, 438/787–794, 958
See application file for complete search history.

(56) References Cited

U.S. PATENT DOCUMENTS

| 5,795,833 | A * | 8/1998 | Yu et al. ..................... 438/763 |
| 6,291,331 | B1 * | 9/2001 | Wang et al. ................. 438/618 |
| 6,426,016 | B1 * | 7/2002 | Yang et al. ................... 216/79 |
| 6,523,494 | B1 * | 2/2003 | Perng et al. ............. 118/723 E |

OTHER PUBLICATIONS

Wolf et al. , Silicon Processing for the VLSI Era, vol. I, Lattice Press, 1986, pp. 166-174, 182-195.*

* cited by examiner

*Primary Examiner*—Michael Lebentritt
*Assistant Examiner*—Angel Roman
(74) *Attorney, Agent, or Firm*—Jianq Chyun IP Office

(57) ABSTRACT

A method of fabricating a passivation layer is provided. A substrate with a plurality of device structures and at least an interconnect thereon is provided. A patterned metallic layer is formed over the interconnection layer. A plasma-enhanced chemical vapor deposition process is performed to form a first passivation over the metallic layer such that the processing pressure is higher (and/or the processing power is lower) than the pressure (the power) used in prior art. A moisture impermeable second passivation is formed over the first passivation layer. With the first passivation formed in a higher processing pressure (and/or lower processing power), damages to metallic layers or devices due to plasma bombardment is minimized.

8 Claims, 2 Drawing Sheets

METHOD FOR FABRICATING PASSIVATION LAYER

CROSS REFERENCE TO RELATED APPLICATIONS

This application claims the priority benefit of Taiwan application serial no. 92127267, filed Oct. 2, 2003.

BACKGROUND OF INVENTION

1. Field of the Invention

The present invention relates to a semiconductor fabrication process. More particularly, the present invention relates to a method of fabricating a passivation layer.

2. Description of the Related Art

In the manufacturing of semiconductors, a large number of steps is carried out to form logic and memory devices as well as interconnects electrically connected with those devices on a silicon wafer. After forming the interconnects, a patterned metallic layer is frequently formed over the wafer to serve as electrical contacts for connecting the devices and interconnects with corresponding external devices. To protect various devices on the wafer, an additional passivation layer is often formed over the substrate. In general, the passivation layer includes a silicon oxide layer and a silicon nitride layer. The silicon oxide layer mainly serves as an insulator and a stress reliever and the silicon nitride layer mainly serves as a barrier preventing the penetration of moisture.

Conventionally, the passivation layer is formed by forming silicon oxide over the patterned metallic layer and then forming silicon nitride over the silicon oxide layer. To prevent the heat generated in a chemical vapor deposition process from affecting the interconnects and devices underneath the metallic layer, a cooler deposition process such as the plasma-enhanced chemical vapor deposition process is performed. The plasma-enhanced chemical vapor deposition process can be directly applied to form a complete silicon oxide layer. Alternatively, the plasma-enhanced chemical deposition process is applied to form a high-density silicon oxide film over the patterned metallic layer first and then a semi-atmospheric chemical vapor deposition process is performed to form a thick silicon oxide layer over the silicon oxide film. And then, a following plasma plasma-enhanced chemical vapor deposition is performed again.

However, using a plasma-enhanced chemical vapor deposition process to form a silicon oxide layer often leads to a few problems. In the deposition process, when the reactive gases are constantly bombarded by plasma to make the gases ionized, the surface of the wafer is also bombarded by plasma. Therefore, the metallic layer over the surface of the wafer or the device underneath the metallic layer may lead to some structural or electrical damage. These damages to the logic or memory devices may lead to short circuit or device leakage problems. In particular, structural damage to a memory device often leads to a drop in charge storage capacity and hence a shortening of data retention time.

SUMMARY OF INVENTION

Accordingly, at least one objective of the present invention is to provide a method of fabricating a passivation layer. By using the method, the issue of having short circuit or leakage current problems in devices due to excessive damages to the metallic layer or device structure after a plasma-enhanced chemical deposition process is performed to form a silicon oxide layer can be resolved.

To achieve these and other advantages and in accordance with the purpose of the invention, as embodied and broadly described herein, the invention provides a method of fabricating a passivation layer. First, a substrate having a plurality of device structures and at least an interconnect thereon are provided. A patterned metallic layer is formed over the interconnect. Thereafter, a plasma-enhanced chemical vapor deposition process is performed to form a first passivation layer over the metallic layer. A pressure greater than the conventional process such as between 9 to 25 Torrs is used in the plasma-enhanced chemical vapor deposition process. A moisture impermeable second passivation layer is formed over the first passivation layer. In the aforementioned plasma-enhanced chemical vapor deposition process, a processing power smaller than a conventional process such as between 1 to 600 Watts can be selected.

Because a higher pressure is used in fabricating the first passivation layer, the mean free path between ions is shortened. In other words, the plasma bombardment ability is reduced on average. With lesser ability, the degree of damage to the metallic layer and internal devices due to plasma bombardment is greatly reduced. Thus, the issue of having a large leakage current in devices and a shorter of data retention time in memory devices due to excessive damages to the metallic layer or device structure after a plasma-enhanced chemical deposition process is resolved.

In addition, aside from using a higher pressure to form the first passivation layer, a lower processing power can be used to carry out the deposition so that the ability of the plasma bombarding the metallic layer or the device structures is reduced. Obviously, a higher pressure and a lower processing power can be used in the plasma-enhanced vapor deposition process to form the first passivation layer and reduce the strength of the bombarding plasma on the metallic layers and the devices. In other words, by adjusting the parameters of the plasma-enhanced chemical vapor deposition process, this invention is able to form a first passivation layer with less damaging the metallic layers or device structures on a wafer.

This invention also provides an alternative method of fabricating a passivation layer. First, a substrate having a plurality of device structures and at least an interconnect thereon is provided. A patterned metallic layer is formed over the interconnect. Thereafter, a semi-atmospheric chemical vapor deposition process is performed to form a first passivation layer over the metallic layer. Finally, a moisture impermeable second passivation is formed over the first passivation layer.

In the aforementioned method, a semi-atmospheric chemical vapor deposition process instead of a plasma-enhanced chemical vapor deposition process is used to form the first passivation layer. Since there is no plasma bombardment in a semi-atmospheric chemical vapor deposition process, the metallic layers or the device structures are no longer damaged after the deposition process. Furthermore, compared with the conventional method of performing a plasma-enhanced chemical vapor deposition process followed by the semi-atmospheric chemical vapor deposition process to form a silicon oxide passivation layer, the method of this invention is a lot simpler.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
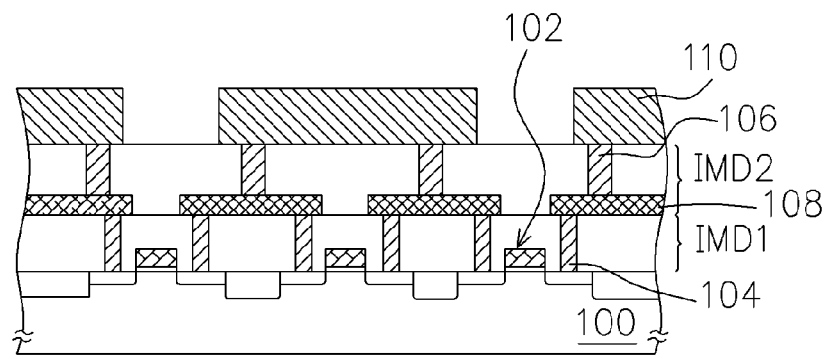
FIGS. 1A through 1C are schematic cross-sectional views showing the steps for fabricating a passivation layer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
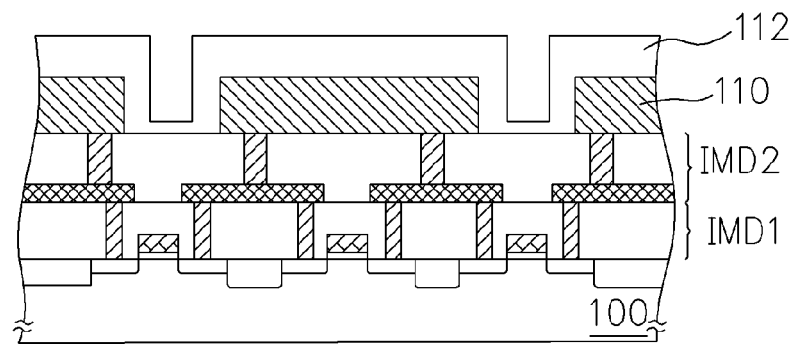
Figure 1C:
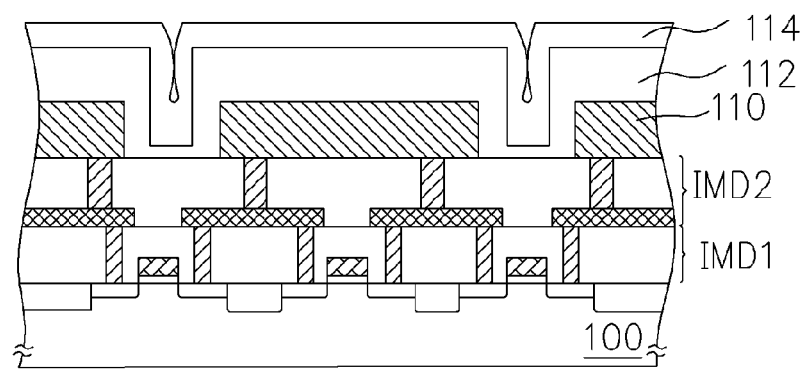

After forming the devices as well as interconnects electrically connected with them on a silicon wafer, a patterned metallic layer is formed over the top layer of the interconnects to serve as electrical contacts for connecting the devices with corresponding external devices. To protect various devices on the wafer, a passivation layer is often formed over the substrate. FIGS. 1A through 1C are schematic cross-sectional views showing the steps for fabricating a passivation layer according to one preferred embodiment of this invention.

As shown in FIG. 1A, a substrate 100 having a plurality of device structures 102 and at least an interconnect thereon is provided. The substrate 100 is a silicon wafer and the device structures 102 are metal-oxide-semiconductor (MOS) transistors, logic devices or memory devices, for example. The interconnect comprises inter-metallic dielectric layers (IMD1 and IMD2), contact plugs (104 and 106) and conductive lines 108. Although a two-layered interconnect is shown in FIG. 1A, there is no limit to the number of layers in the interconnection layer.

A patterned metallic layer 110 is formed over the inter-metallic dielectric layer IMD2 above the substrate 100. The metallic layer 110 is formed, for example, by depositing metallic material over the inter-metallic dielectric layer IMD2 to cover the contact plugs 106 and then performing photolithographic and etching process. The patterned metallic layer 110 is electrically connected with the contact plugs (104 and 106) and the conductive lines 108 so that the devices can connect electrically with external devices via the metallic layer 110.

As shown in FIG. 1B, a plasma-enhanced chemical vapor deposition process is performed to form a passivation layer 112 over the metallic layer 110. The passivation layer 112 is a silicon oxide layer so that the passivation layer can serve as an insulator.

During the plasma-enhanced chemical vapor deposition process, a pressure greater than the conventional plasma-enhanced chemical vapor deposition process such as between 9 to 25 Torrs are used. With a higher pressure, the bombardmenton the metallic layer 110 and the device structures 102 by plasma is mitigated when reactive gases are bombarded by plasma for ionizing.

Further, a lower processing power can be used during the plasma-enhanced chemical vapor deposition process to form the passivation layer 112 so that the effect of plasma bombardment is reduced. For example, a processing power between 1 to 600 Watts may be used.

In an alternative embodiment of this invention, a higher pressure (for example, between 9 to 25 Torrs) and a lower processing power (for example, between 1 to 600 Watts) can be used in the plasma-enhanced chemical vapor deposition process to form the passivation layer 112. Obviously, the bombarding plasma has the least effect on the metallic layers 110 and the device structures 102 with this arrangement.

As shown in FIG. 1C, a moisture impermeable passivation layer 114 is formed over the passivation layer 112. The passivation layer 114 is fabricated using silicon nitride, for example, so that moisture in the air is prevented from diffusing into the substrate 100. The passivation layer 114 is formed, for example, by performing a plasma-enhanced chemical vapor deposition process or an atmospheric pressure chemical vapor deposition process.

Note that if neighboring patterned metallic layers 110 are really close together, poor step coverage in the process of forming the passivation layer 114 may produce a void in the gap between neighboring metallic layer 110. However, this void has very little effect on the protective function of the passivation layer 114. On the contrary, the air enclosed inside the void may increase the insulating capacity of the passivation layers (112 and 114) because air has a lower dielectric constant.

Because a higher pressure is used in fabricating the passivation layer 112, the mean free path between ions is shortened. In other words, the plasma bombardment ability is reduced on average. With lesser ability, the degree of damage to the metallic layers 110 and internal device structures 102 due to plasma bombardment is greatly reduced. Thus, the issue of having a leakage current in devices and a shorter data retention time in memory devices due to excessive damages to the metallic layers 110 or device structures 102 after a plasma-enhanced chemical deposition process is resolved.

In addition, aside from using a higher pressure to form the passivation layer 112, a lower processing power can be used to carry out the deposition so that the degree of the plasma bombarding the metallic layers 110 or the device structures 102 is reduced. Obviously, a higher pressure and a lower processing power can be used in the plasma-enhanced vapor deposition process to form the passivation layer 112 and reduce the strength of the bombarding plasma on the metallic layers 110 and the device structures 102. In other words, by adjusting the parameters of the plasma-enhanced chemical vapor deposition process, this invention is able to form the passivation layer 112 with less damaging the metallic layers 110 or device structures 102 on a wafer.

Figure 2A:
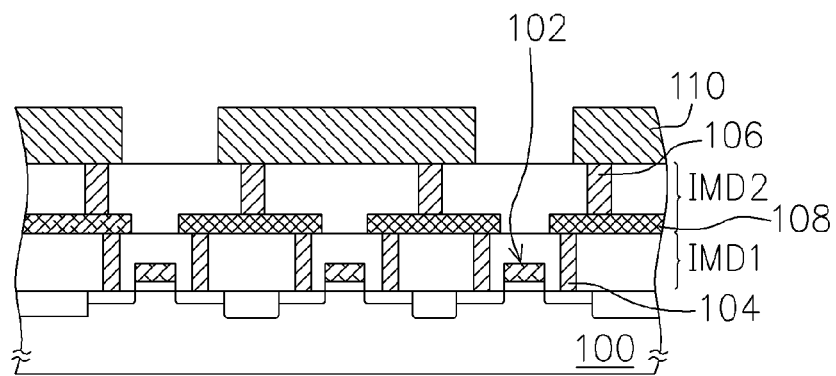
FIGS. 2A through 2C are schematic cross-sectional views showing the steps for fabricating a passivation layer according to another preferred embodiment of this invention.
Figure 2B:
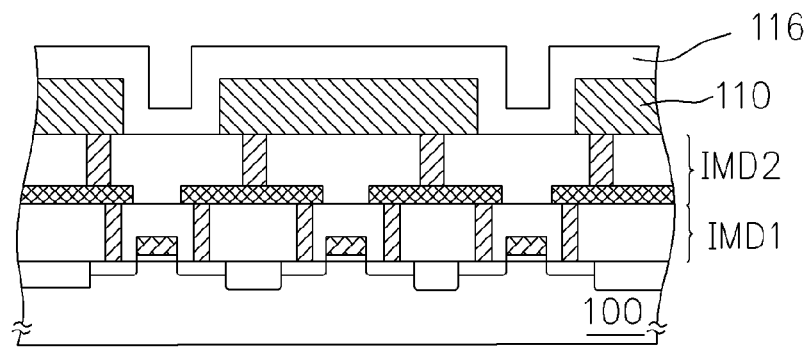
Figure 2C:
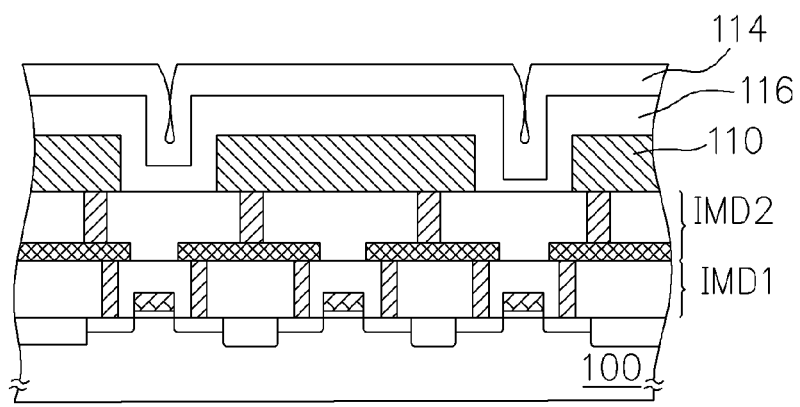

FIGS. 2A through 2C are schematic cross-sectional views showing the steps for fabricating a passivation layer according to another preferred embodiment of this invention. Similarly, the process of fabricating the passivation layer is carried out after forming logic and memory devices, interconnects and patterned metallic layers on a silicon wafer. First, as shown in FIG. 2A, a substrate 100 having a plurality of device structures 102 and at least an interconnect thereon is provided. The substrate 100 is a silicon wafer and the device structures are metal-oxide-semiconductor (MOS) transistors, logic devices or memory devices, for example. The interconnect comprises inter-metallic dielectric layers (IMD1 and IMD2), contact plugs (104 and 106) and conductive lines 108. Although a two-layered interconnect is shown in FIG. 2A, there is no limit to the number of layers in the interconnection layer.

A patterned metallic layer 110 is formed over the inter-metallic dielectric layer IMD2 above the substrate 100. The metallic layer 110 is formed, for example, by depositing metallic material over the inter-metallic dielectric layer IMD2 to cover the contact plugs 106 and then performing photolithographic and etching process. The patterned metallic layer 110 is electrically connected with the contact plugs (104 and 106) and the conductive lines 108 so that the devices can connect electrically with external devices via the metallic layer 110.

As shown in FIG. 2B, a semi-atmospheric chemical vapor deposition process is performed to form a passivation layer 116 over the metallic layer 110. The passivation layer 116 is, for example, a silicon oxide layer that serves as an insulator. The semi-atmospheric chemical vapor deposition process is carried out at a temperature between 200° C. to 600° C. using liquid tetra-ethyl-ortho-silicate (TEOS) and ozone as the reactive materials. Typically, the flow rate of TEOS is set to a value between 500 to 3000 sccm and the flow rate of ozone is set to a value between 5000 to 15000 sccm. In addition, a pressure between 20 to 750 Torrs is set up within the deposition chamber.

Note that using a semi-atmospheric chemical vapor deposition process instead of a plasma-enhanced chemical vapor deposition process to form the passivation layer 116 eliminates all the damages associated with the process of bombarding and ionizing the reactive gases with a plasma.

As shown in FIG. 2C, a moisture impermeable passivation layer 114 is formed over the passivation layer 116. The passivation layer 114 is fabricated using silicon nitride, for example, so that moisture in the air is prevented from diffusing into the substrate 100. The passivation layer 114 is formed, for example, by performing a plasma-enhanced chemical vapor deposition process or an atmospheric pressure chemical vapor deposition process.

Note that if neighboring patterned metallic layers 110 are really close together, poor step coverage in the process of forming the passivation layer 114 may produce a void in the gap between neighboring metallic layer 110. However, this void has very little effect on the protective function of the passivation layer 114. On the contrary, the air enclosed inside the void may increase the insulating capacity of the passivation layers (116 and 114) because air has a lower dielectric constant.

In the aforementioned method, a semi-atmospheric chemical vapor deposition process instead of a plasma-enhanced chemical vapor deposition process is used to form the passivation layer 116. Since there is no plasma bombardment in a semi-atmospheric chemical vapor deposition process, the metallic layers 110 or the device structures 102 are no longer damaged after the deposition process. Furthermore, compared with the conventional method of performing a plasma-enhanced chemical vapor deposition process followed by the semi-atmospheric chemical vapor deposition process to form the passivation layer 116, the method of this invention is a lot simpler.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of fabricating a passivation layer, comprising the steps of:
    providing a substrate having a plurality of device structures and at least an interconnect thereon;
    forming a patterned metallic layer over the interconnect;
    performing a plasma-enhanced chemical vapor deposition process to form a first passivation layer directly on the metallic layer, wherein the plasma-enhanced chemical vapor deposition process is carried out at a processing pressure between 21 to 25 Torrs and with a processing power between 1 to 45 Watts; and
    forming a moisture impermeable second passivation layer over the first passivation layer.

2. The method of claim 1, wherein the first passivation layer comprises a silicon oxide layer.

3. The method of claim 1, wherein the second passivation layer comprises a silicon nitride layer.

4. A method of fabricating a passivation layer, comprising the steps of:
    providing a substrate having a plurality of device structures and at least an interconnect thereon;
    forming a patterned metallic layer over the interconnect;
    performing a semi-atmospheric chemical vapor deposition process with liquid tetra-ethyl-ortho-silicate (TEOS) and ozone inside a reaction chamber to form a first passivation layer directly on the metallic layer, wherein the liquid tetra-ethyl-ortho-silicate flowing into the reaction chamber has a flow rate between 500 sccm to 3000 sccm and the ozone flowing into the reaction chamber has a flow rate between 5000 sccm to 15000 sccm; and
    forming a moisture impermeable second passivation layer over the first passivation layer.

5. The method of claim 4, wherein the pressure inside the reaction chamber during the semi-atmospheric chemical vapor deposition process is between about 20 to 750 Torrs.

6. The method of claim 4, wherein the semi-atmospheric chemical vapor deposition process is carried out at a temperature between about 200° C. to 600° C.

7. The method of claim 4, wherein the first passivation layer comprises a silicon oxide layer.

8. The method of claim 4, wherein the second passivation layer comprises a silicon nitride layer.

* * * * *